United States Patent
Blair et al.

(10) Patent No.: US 8,258,014 B2
(45) Date of Patent: Sep. 4, 2012

(54) METHOD OF MANUFACTURING A POWER TRANSISTOR MODULE AND PACKAGE WITH INTEGRATED BUS BAR

(75) Inventors: Cynthia Blair, Morgan Hill, CA (US); Donald Fowlkes, San Jose, CA (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/174,048

(22) Filed: Jun. 30, 2011

(65) Prior Publication Data

US 2011/0258844 A1    Oct. 27, 2011

Related U.S. Application Data

(62) Division of application No. 12/367,719, filed on Feb. 9, 2009, now Pat. No. 7,994,630.

(51) Int. Cl.
     *H01L 23/48*    (2006.01)
(52) U.S. Cl. ........ 438/117; 438/411; 438/461; 438/611; 257/401; 257/300; 257/379; 257/691; 257/711; 257/723; 257/664; 257/666; 257/E23.17; 257/E23.175

(58) Field of Classification Search ............ 438/117, 438/411, 461, 611; 257/401, 300, 379, 691, 257/711, 723, 664, 666, E23.17, E23.175
See application file for complete search history.

(56) References Cited

U.S. PATENT DOCUMENTS

| | | | |
|---|---|---|---|
| 6,414,389 B1 * | 7/2002 | Hume et al. | 257/732 |
| 6,466,094 B2 * | 10/2002 | Leighton et al. | 330/302 |
| 2007/0024358 A1 * | 2/2007 | Perugupalli et al. | 330/66 |

* cited by examiner

*Primary Examiner* — Marc Armand
(74) *Attorney, Agent, or Firm* — Murphy, Bilak & Homiller, PLLC

(57) ABSTRACT

According to an embodiment of a method of manufacturing a power transistor module, the method includes mechanically fastening a first terminal, a second terminal and at least two different DC bias terminals to an electrically conductive flange; connecting the flange to a source of a power transistor device; electrically connecting the first terminal to a gate of the power transistor device; electrically connecting the second terminal to a drain of the power transistor device; mechanically fastening a bus bar to the flange which extends between and connects the DC bias terminals; and electrically connecting the bus bar to the drain via one or more RF grounded connections.

20 Claims, 4 Drawing Sheets

METHOD OF MANUFACTURING A POWER TRANSISTOR MODULE AND PACKAGE WITH INTEGRATED BUS BAR

PRIORITY CLAIM

This application is a divisional of, and claims priority to, U.S. application Ser. No. 12/367,719 filed 9 Feb. 2009, the content of said application being incorporated herein by reference in its entirety.

BACKGROUND

Power transistor packages typically include a conductive flange on which an insulative window is arranged. A power transistor is mounted to the flange within the window so that the source of the power transistor can be directly connected to the flange and grounded. Input and output terminals are attached to the insulative window so that input (gate) and output (drain) connections, respectively, can be made to the power transistor. The drain of the power transistor must be sufficiently DC biased to ensure proper operation. A DC feed path is typically provided in the form of one or more DC feed terminals each of which is attached to the insulative window so that the drain of the power transistor can be biased. For example, one DC feed terminal may be spaced apart from and extend along one side of the output terminal while another DC feed terminal is spaced apart from and extends along the other side of the output terminal as disclosed in U.S. Pat. No. 6,734,728, the contents of which are incorporated herein by reference in their entirety.

The end of each DC feed terminal is typically wire bonded to an output matching blocking capacitor coupled via a matching inductance to the drain of the power transistor. The output matching inductance is provided an RF ground by this capacitor. The juncture of this inductance and capacitance create an RF "cold" point that may be used to apply DC and/or decouple and terminate low frequencies. The end of the DC feed terminal which terminates adjacent the output capacitor has limited area for connecting the DC feed terminal to the matching capacitor. This limits the number of wire bond connections which can be made between the end of the DC feed terminal and the output capacitor. Accordingly, only a few bond wires are available for carrying the entire DC bias current to the drain of the power transistor. Power transistors having high operating currents cannot reliably employ conventional DC feed structures because only a few wire bonds connect the DC feed terminal to the output capacitor, thereby limiting the low frequency current carrying capability of the package.

In addition, the wire bonds typically extend from the end of each DC feed terminal to respective ends of the output capacitor. This node of the capacitor is also wire bonded to the drain of the power transistor and the other capacitor node is grounded. However, feeding DC power only to the ends of the output capacitor induces an IR drop between the ends and center region of the capacitor node. Accordingly, the center of the capacitor node is not at the same low frequency potential as the ends of the node during operation of the power transistor. This IR drop propagates to the drain of the power transistor, creating unbalanced low frequency termination points across the drain. This causes some regions of the drain (e.g., the end regions) to be biased differently than other regions of the drain (e.g., the center region), causing unintentional LC filtering which degrades power transistor performance. The IR drop across the capacitor node worsens as a function of capacitor length, limiting the length of the capacitor and thus the number of power transistors which can be included in the package.

SUMMARY

According to an embodiment of a method of manufacturing a power transistor module, the method includes: mechanically fastening a first terminal, a second terminal and at least two different DC bias terminals to an electrically conductive flange; connecting the flange to a source of a power transistor device; electrically connecting the first terminal to a gate of the power transistor device; electrically connecting the second terminal to a drain of the power transistor device; mechanically fastening a bus bar to the flange which extends between and connects the DC bias terminals; and electrically connecting the bus bar to the drain via one or more RF grounded connections.

According to an embodiment of a method of manufacturing a power transistor package, the method includes: mechanically fastening a first terminal to an electrically conductive flange; mechanically fastening a second terminal to the flange; mechanically fastening at least two different DC bias terminals to the flange; mechanically fastening a bus bar to the flange which extends between and connects the DC bias terminals; and RF grounding the bus bar.

According to another embodiment of a method of manufacturing a power transistor module, the method includes: connecting an electrically conductive flange of a package to a source of at least two power transistor devices; mechanically fastening a first terminal to the flange; electrically connecting the first terminal to a gate of each of the at least two power transistor devices; mechanically fastening a second terminal to the flange; electrically connecting the second terminal to a drain of the at least two power transistor devices; mechanically fastening a bus bar to the flange which extends between and connects at least two different DC bias terminals mechanically fastened to the flange; and electrically connecting the bus bar to the drain of each of the at least two power transistor devices via one or more RF grounded connections.

Those skilled in the art will recognize additional features and advantages upon reading the following detailed description, and upon viewing the accompanying drawings.

DETAILED DESCRIPTION

Figure 1:
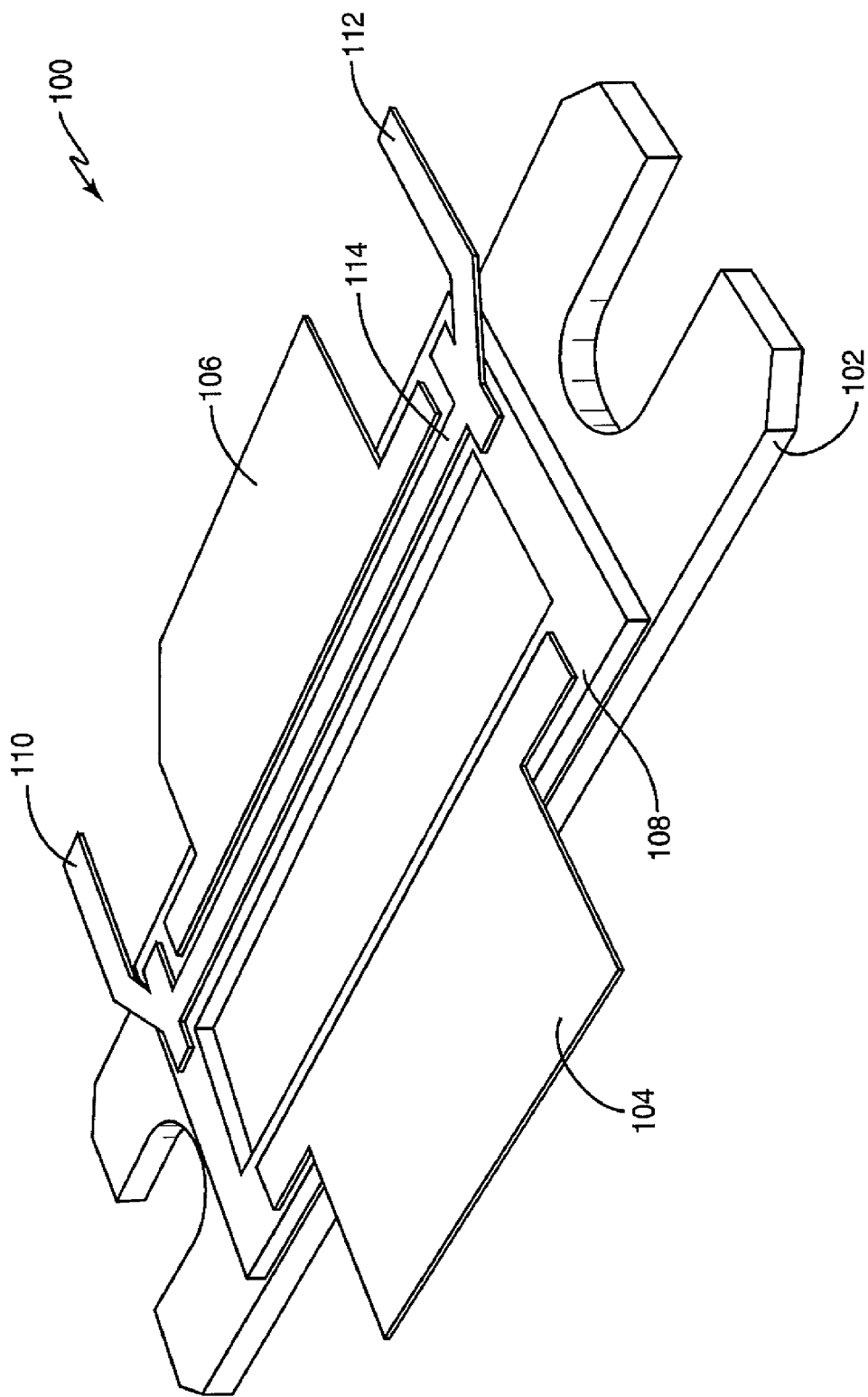
FIG. 1 is a three-dimensional view of an embodiment of a power transistor package.

FIG. 1 illustrates a three-dimensional view of an embodiment of a power transistor package 100. The package 100 includes an electrically conductive flange 102 having input and output terminals 104, 106 mechanically fastened to the flange 102. In one embodiment, an insulative member 108 is disposed on the flange 102 and the input and output terminals 104, 106 are fastened to the insulative member 108, electrically isolating the terminals 104, 106 from the flange 102. At least two different DC bias terminals 110, 112 are also mechanically fastened to the flange 102, e.g., on the insulative window 108. In one embodiment, the DC bias terminals 110, 112 are spaced apart from and extend along the sides of the output terminal 106. The package 100 further includes a bus bar 114 mechanically fastened to the flange 102, e.g., on the insulative window 108.

The bus bar 114 extends between and connects the DC bias terminals 110, 112. In one embodiment, the bus bar can be any type of metallization arranged as a generally flat strip. The bus bar 114 provides a low frequency and DC connection bus that runs the entire length of a power transistor device (not shown in FIG. 1) attached to the package 100. Thus, the bus bar 114 has minimum IR drop over the entire length of the bus bar 114. In addition, the bus bar 114 allows for more even terminations, higher current handling, increased reliability and added flexibility. The bus bar 114 also improves the high frequency characteristics of the power transistor device attached to the package 100 by making the terminations balanced across all sections of the transistor drain as described in more detail later herein. A power transistor having balanced drain terminations can provide improved video bandwidth because the path to the modulation terminations is of very low inductance.

Figure 2:
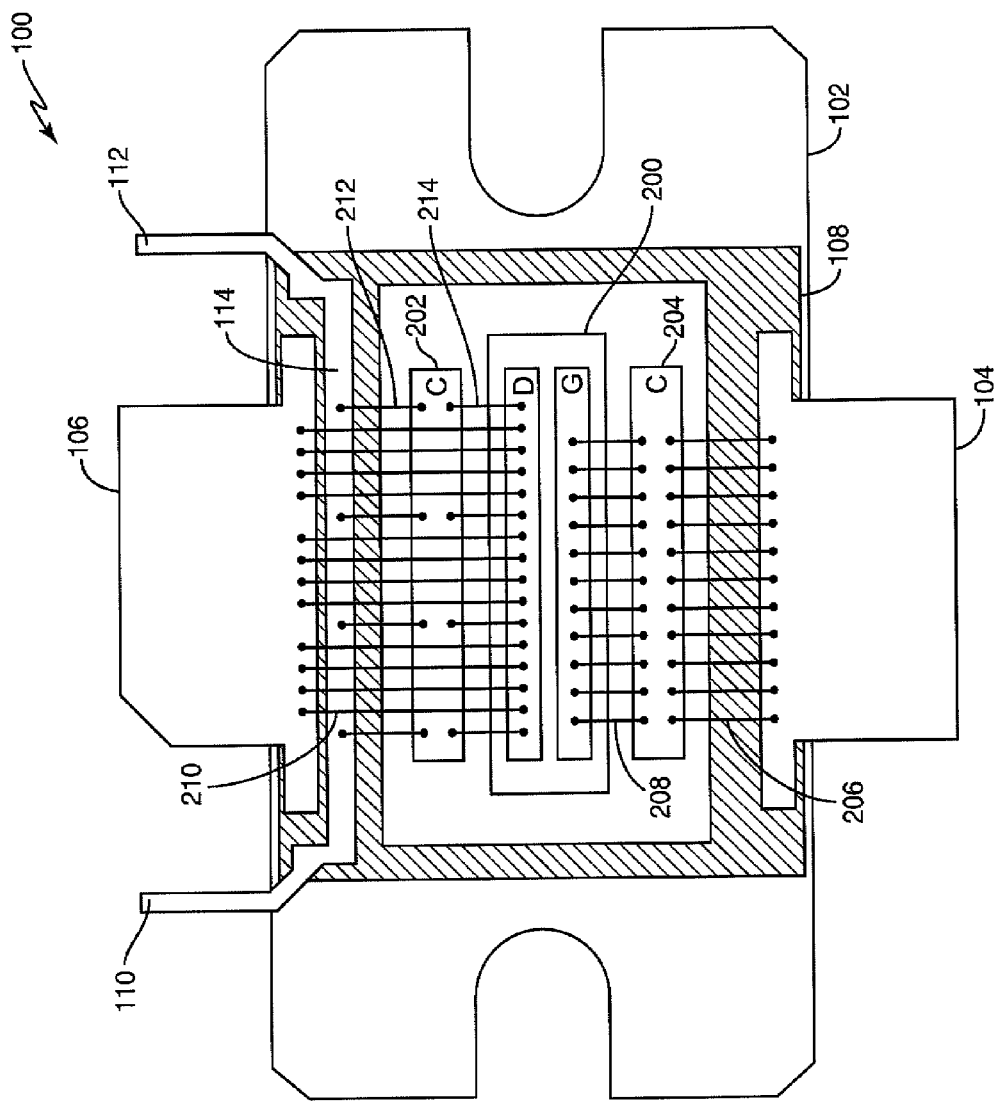
FIG. 2 is a plan view of the power transistor package of FIG. 1.

FIG. 2 shows a plan view of the package 100 with a power transistor device 200 and capacitors 202, 204 mounted to the package 100. The power transistor 200 has a source terminal disposed at the bottom side of the transistor 200, a drain (D) and a gate (G). The flange 102 is connected to the source and grounded in one embodiment. However, the flange 102 and source can be tied to any desirable voltage level. The input terminal 104 is electrically connected to the gate of the transistor 200 and the output terminal 106 is electrically connected to the drain, e.g., via respective groups of bond wires 206-214. The bus bar 114 is electrically connected to the drain via one or more RF grounded connections.

According to one embodiment, the RF grounded connections comprise a first group of bond wires 212 connecting the bus bar 114 to a first conductor of an output matching capacitor 202 and a second group of bond wires 214 connecting the first conductor of the output capacitor 202 to the drain of the power transistor 200. The capacitor 202 has a second conductor on its bottom side connected to RF ground, e.g., via the flange 102. The group of bond wires 214 connecting the first conductor of the output capacitor 202 to the drain can be sized appropriately to function as tuning wires so that the drain-to-source capacitance of the power transistor device 200 resonates slightly below a desired band of operation.

In addition, the first and second groups of bond wires 212, 214 together with the bus bar 114 form an integrated DC and modulating frequency feed path which provides balanced termination points across substantially all of the transistor drain. Also, the entire length of the bus bar 114 is available for making bond wire connections to the output matching capacitor 202 and the drain. This significantly increases the current-carrying capability of the package 100. In some embodiments, a sufficient number of bond wire connections are made from the bus bar 114 to the output matching capacitor 202 and from the output capacitor 202 to the drain so that the package 100 can reliably accommodate power levels of at least 300 W. In one embodiment, the bus bar 114 extends between and connects the DC bias terminals 110, 112 over at least a length of the power transistor device 200 as shown in FIG. 2. Accordingly, the number of bond wires available to connect the DC bias terminals 110, 112 to the drain is limited by the length of the power transistor device 200, the surface area of the bus bar 114 and the wiring ground rules associated with the bond wire technology employed to manufacture the package 100.

The first and second groups of bond wires 212, 214 also form a low inductance feed path between the bus bar 114 and the drain of the power transistor 200. The low inductance feed path can provide low frequency termination at frequencies ranging from about 0-100 MHz. Low frequency termination of this kind is beneficial for video applications such as COFDM (coded orthogonal frequency-division multiplexing) where signal power levels rise and fall rapidly. Under such rapid signal switching conditions, a high inductance feed can cause repetitive L di/dt avalanche breakdown conditions to occur in the power transistor 200. However, the low inductance feed path formed by the first and second groups of bond wires 212, 214 provides a relatively low inductance path between the DC bias terminals 110, 112 and the drain of the power transistor 200. This in turn reduces L di/dt induced voltage peaks which tend to occur in certain applications such as COFDM video. The low inductance feed path formed by the first and second groups of bond wires 212, 214 also increases the operating signal bandwidth of the power transistor 200 which is beneficial for certain applications such as video or wireless infrastructure.

Figure 3:
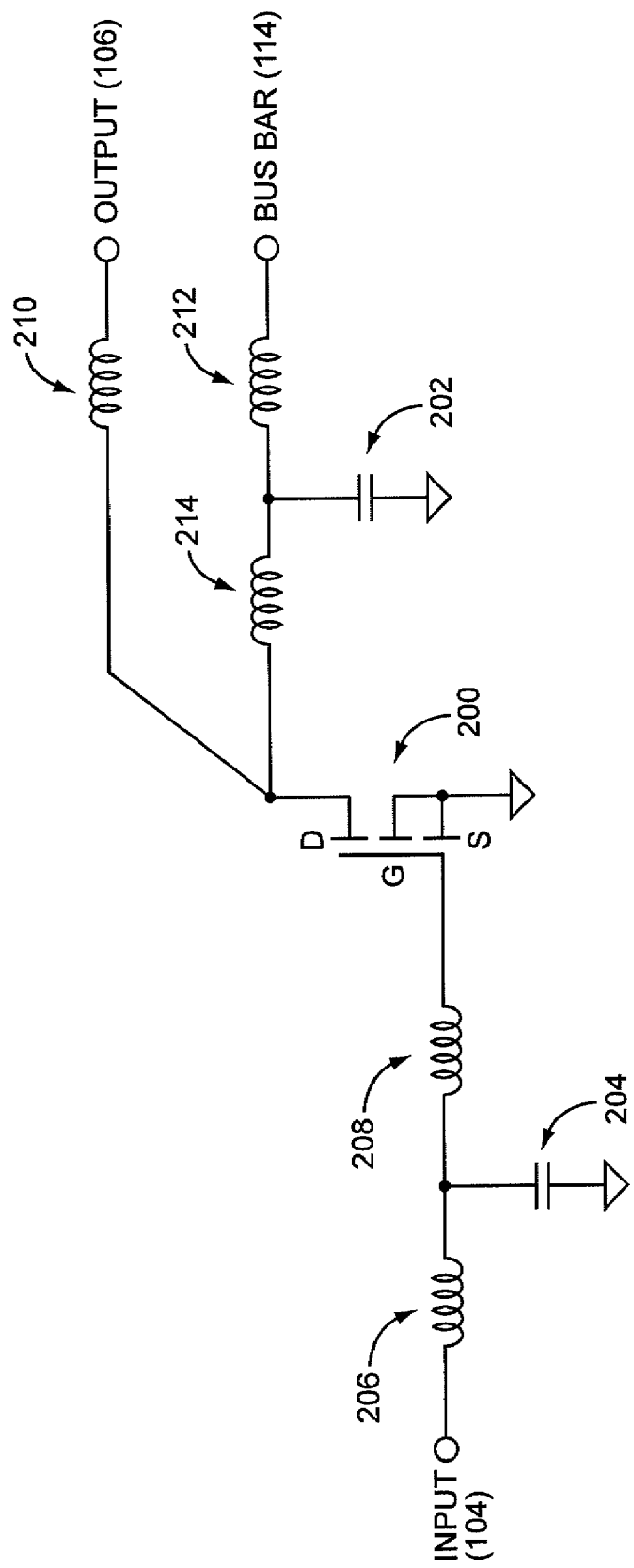
FIG. 3 is an equivalent circuit diagram of the power transistor package of FIG. 1.

FIG. 3 is an equivalent circuit diagram of the power transistor package 100 illustrated in FIG. 2. On the input side, the gate (G) of the power transistor 200 is coupled to a node of an input matching capacitor 204 via a group of bond wires 208. This node of the input capacitor 204 is also coupled to the input terminal 104 via another group of bond wires 206. The bottom node (out of view) of the capacitor 204 is connected to RF ground. The length of the input-side bond wires 206, 208 and value of the input matching capacitor 204 can be selected so that a desired input matching network is realized. The input terminal 104 may also have a DC blocking capacitor (not shown) for blocking low frequency signals from the RF input of the power transistor 200. At the output side, low frequency bias is applied to the drain (D) of the power transistor 200 via the DC bias terminals 110, 112 and the bus bar 114 as explained above. The output terminal 106 may also have a DC blocking capacitor (not shown) for blocking low frequency signals from the RF output of the power transistor 200. The length of the output-side bond wires 210-214 and value of the output matching capacitor 202 can be selected so that a desired output matching network is realized. In addition, more than one power transistor 200 can be attached to the package 100 since the bus bar 114 can provide relatively balanced drain termination points over the entire length of the bus bar 114 as explained above.

Figure 4:
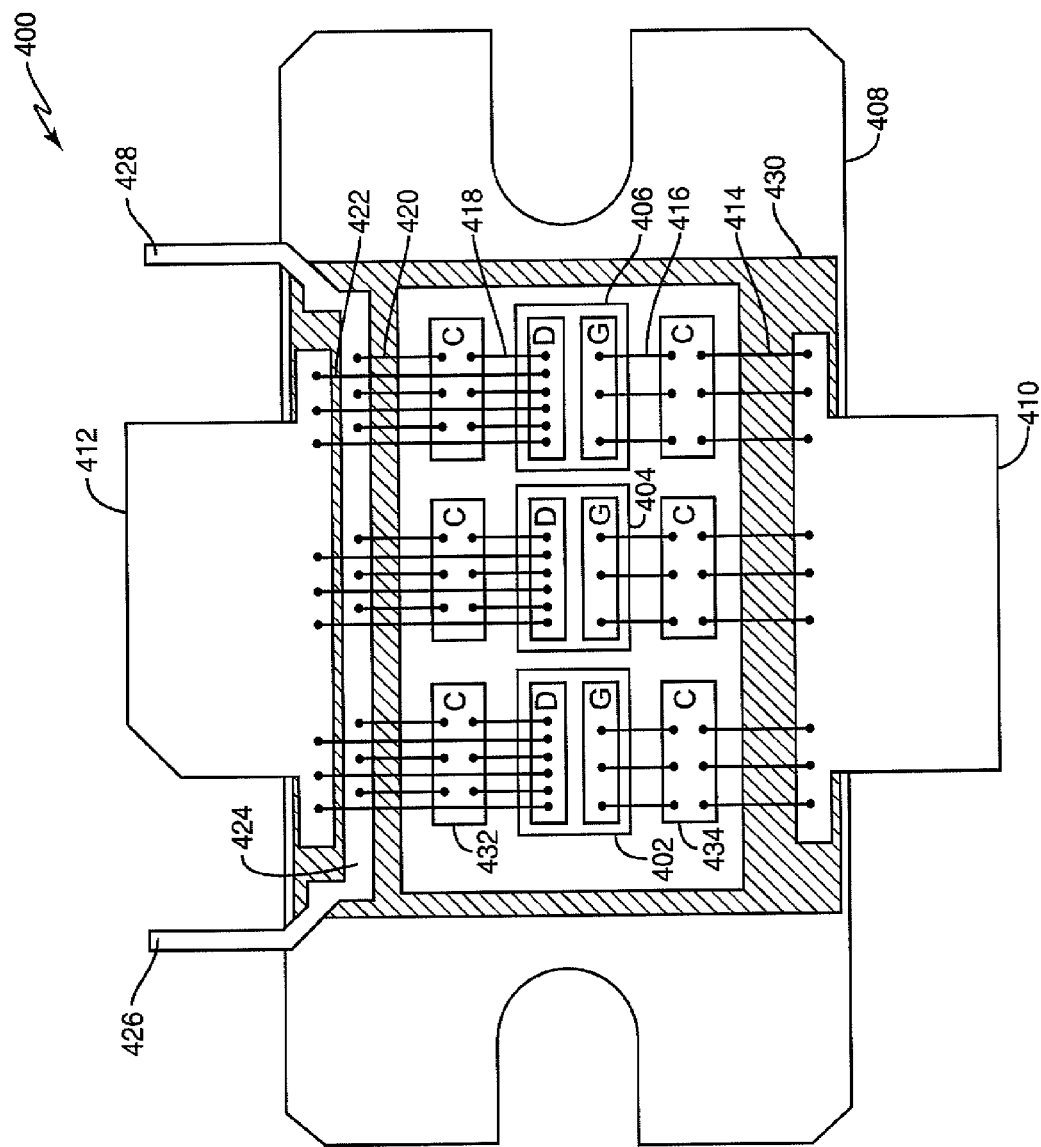
FIG. 4 is a three-dimensional view of another embodiment of a power transistor package.

FIG. 4 illustrates a plan view of a package 400 with three different power transistor devices 402-406 fastened to the package 400 for handling even higher power applications. Each power transistor 402-406 has a source (S), a drain (D) and a gate (G). A flange 408 of the package 400 is connected to the source of each transistor 402-406. An input terminal 410 is mechanically fastened to the flange 408 and electrically connected to the gate of each transistor 402-406, e.g., via bond wires 414, 416. An output terminal 412 is also mechanically fastened to the flange 408 and electrically connected to the drain of each transistor 402-406, e.g., via bond wires 418-422. A bus bar 424 extends between and connects at least two different DC bias terminals 426, 428 mechanically fastened to the flange 408. In one embodiment, the input and output terminals 410, 412, the DC bias terminals 426, 428 and the bus bar 424 are mechanically fastened to an insulative member 430 disposed on the flange 408.

The bus bar 424 is electrically connected to the drain of each power transistor 402-406 via one or more RF grounded connections. Each RF grounded connection comprises a first group of bond wires 420 connecting the bus bar 424 to a respective RF grounded output matching capacitor 432 and a second group of bond wires 418 connecting the capacitor 432 to the corresponding power transistor drain as explained above.

In addition, the first and second groups of bond wires 418, 420 coupled to each transistor drain together with the bus bar 424 form an integrated DC feed path which provides balanced termination points across substantially all of the drain as explained above. In one embodiment, the bus bar 424 extends between and connects the DC bias terminals 426, 428 over at least a combined length of all of the power transistor devices 402-406 as shown in FIG. 4. The first and second groups of bond wires 418, 420 coupled to each power transistor drain also form a low inductance feed path between the bus bar 424 and the corresponding drain. The low inductance feed path can provide low frequency termination at frequencies ranging from about 0-100 MHz as described above. Input matching capacitors 434 can also be provided, along with input and output DC blocking capacitors (not shown) as described above. Any desirable number of power transistor devices can be attached to the packages 100, 400 described herein because the bus bars 114, 424 can be designed to extend over the entire length of all devices, providing well balanced low frequency termination points to all devices with negligible IR drop.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a power transistor module, comprising:
   mechanically fastening a first terminal, a second terminal and at least two different DC bias terminals to an electrically conductive flange;
   connecting the flange to a source of a power transistor device;
   electrically connecting the first terminal to a gate of the power transistor device;
   electrically connecting the second terminal to a drain of the power transistor device;
   mechanically fastening a bus bar to the flange which extends between and connects the DC bias terminals; and
   electrically connecting the bus bar to the drain via one or more RF grounded connections.

2. The method according to claim 1, comprising mechanically fastening the first and second terminals, the bus bar and the DC bias terminals to an insulative member disposed on the flange.

3. The method according to claim 1, comprising:
   connecting the bus bar to a capacitor via a first plurality of bond wires; and
   connecting the capacitor to the drain via a second plurality of bond wires.

4. The method according to claim 1, comprising extending the bus bar between the DC bias terminals over at least a length of the power transistor device.

5. The method according to claim 1, wherein the bus bar comprises a generally flat strip of metallization.

6. The method according to claim 1, wherein the power transistor device is configured to operate at a power level of 300 W or greater.

7. The method according to claim 3, comprising sizing the second plurality of bond wires so that a drain-to-source capacitance of the power transistor device resonates slightly below a desired band of operation.

8. The method according to claim 3, comprising forming an integrated DC feed path from the bus bar and the first and second plurality of bond wires which provides balanced termination points across substantially all of the drain.

9. The method according to claim 3, comprising forming a low inductance feed path from the first and second plurality of bond wires between the bus bar and the drain which provides low frequency termination at frequencies ranging from about 0-100 MHz.

10. A method of manufacturing a power transistor package, comprising:
    mechanically fastening a first terminal to an electrically conductive flange;
    mechanically fastening a second terminal to the flange;
    mechanically fastening at least two different DC bias terminals to the flange;
    mechanically fastening a bus bar to the flange which extends between and connects the DC bias terminals; and
    RF grounding the bus bar.

11. The method according to claim 10, comprising mechanically fastening the first and second terminals, the bus bar and the DC bias terminals to an insulative member disposed on the flange.

12. The method according to claim 10, wherein mechanically fastening a bus bar to the flange which extends between and connects the DC bias terminals comprises connecting the DC bias terminals with a generally flat strip of metallization mechanically fastened to the flange.

13. A method of manufacturing a power transistor module, comprising:
    connecting an electrically conductive flange of a package to a source of at least two power transistor devices;
    mechanically fastening a first terminal to the flange;
    electrically connecting the first terminal to a gate of each of the at least two power transistor devices;
    mechanically fastening a second terminal to the flange;
    electrically connecting the second terminal to a drain of the at least two power transistor devices;
    mechanically fastening a bus bar to the flange which extends between and connects at least two different DC bias terminals mechanically fastened to the flange; and
    electrically connecting the bus bar to the drain of each of the at least two power transistor devices via one or more RF grounded connections.

14. The method according to claim 13, comprising:
- connecting a first plurality of bond wires between the bus bar and at least one capacitor; and
- connecting a second plurality of bond wires between the at least one capacitor and the drain of each power transistor device.

15. The method according to claim 13, wherein the bus bar extends between and connects the DC bias terminals over at least a combined length of all of the power transistor devices.

16. The method according to claim 13, wherein each power transistor device is configured to operate at a power level of 300 W or greater.

17. The method according to claim 13, wherein the bus bar comprises a generally flat strip of metallization.

18. The method according to claim 14, comprising connecting a plurality of tuning wires between the at least one capacitor and the drain of each power transistor device, the plurality of tuning wires sized so that a drain-to-source capacitance of each power transistor device resonates slightly below a desired band of operation.

19. The method according to claim 14, comprising forming a low inductance feed path between the bus bar and the drain of each power transistor device via the first and second plurality of bond wires form which provides low frequency termination at frequencies ranging from about 0-100 MHz.

20. The method according to claim 14, comprising forming an integrated DC feed path via the bus bar and the first and second plurality of bond wires which provides balanced termination points across substantially all of each drain.

\* \* \* \* \*